(12) United States Patent
D'Souza et al.

(10) Patent No.: US 6,179,976 B1
(45) Date of Patent: Jan. 30, 2001

(54) SURFACE TREATMENT AND METHOD FOR APPLYING SURFACE TREATMENT TO SUPPRESS SECONDARY ELECTRON EMISSION

(75) Inventors: Ian A. D'Souza, Waterloo; Andrzej Zybura, Kitchener; James T. Francis, Embro; Bradley A. Kobe, London, all of (CA)

(73) Assignee: COM DEV Limited, Cambridge (CA)

( * ) Notice: Under 35 U.S.C. 154(b), the term of this patent shall be extended for 0 days.

(21) Appl. No.: 09/453,653

(22) Filed: Dec. 3, 1999

(51) Int. Cl.$^7$ ................................................. C23C 14/34
(52) U.S. Cl. ............................ 204/192.15; 204/192.16; 428/697; 313/106
(58) Field of Search ................ 204/192.15, 192.16; 428/697; 313/106

(56) References Cited

U.S. PATENT DOCUMENTS

| | | |
|---|---|---|
| 3,604,970 | 9/1971 | Culbertson et al. .................. 313/107 |
| 3,891,884 | 6/1975 | Tisdale ................................. 313/107 |
| 4,006,073 | 2/1977 | Welch .................................. 204/298 |
| 4,151,325 | 4/1979 | Welch .................................. 428/432 |
| 4,263,528 | 4/1981 | Miram ................................. 313/293 |
| 4,349,424 | 9/1982 | Sovey et al. ..................... 204/192 E |
| 4,417,175 | 11/1983 | Curren et al. ........................ 315/5.38 |
| 4,559,281 | 12/1985 | Derfler et al. ........................ 428/687 |
| 4,607,193 | 8/1986 | Curren et al. ........................ 315/5.38 |
| 5,018,180 | 5/1991 | Shoulders .............................. 378/119 |
| 5,054,047 | 10/1991 | Shoulders .............................. 378/119 |
| 5,123,039 | 6/1992 | Shoulders .............................. 378/119 |
| 5,148,461 | 9/1992 | Shoulders .............................. 378/119 |
| 5,598,056 | 1/1997 | Jin et al. .............................. 313/495 |
| 5,690,530 | 11/1997 | Jin et al. ................................ 445/24 |
| 5,711,860 | 1/1998 | Jensen et al. .................... 204/192.11 |
| 6,055,215 | * 4/2000 | Katsuragawa .......................... 369/13 |

* cited by examiner

Primary Examiner—Nam Nguyen
Assistant Examiner—Steven H. Ver Steeg
(74) Attorney, Agent, or Firm—Jones, Day, Reavis & Pogue

(57) ABSTRACT

A surface treatment and method for applying the surface treatment to electrical components are provided that include a coating of yttrium-iron-garnet (YIG), which is applied to the inner surface of the component by sputtering.

24 Claims, 2 Drawing Sheets

SURFACE TREATMENT AND METHOD FOR APPLYING SURFACE TREATMENT TO SUPPRESS SECONDARY ELECTRON EMISSION

BACKGROUND OF THE INVENTION

1. Field of the Invention

The present invention relates to components for communication devices. More particularly, this invention is a surface treatment and method for applying a surface treatment to microwave components or other components where secondary electron emission must be kept low. The surface treatment is a coating comprised of yttrium-iron-garnet, which is preferably applied to the inner surface of the component by sputtering.

2. Description of the Related Art

Secondary electron emission is a well known problem occurring in electrical components exposed to high frequency (e.g., microwave) electromagnetic radiation. Under such electromagnetic field exposure, when an incident electron impacts onto the surface of the component, additional electrons (so-called secondary electrons) can be emitted from the surface of the component along with the incident electron. These secondary electrons are then subjected to the same electromagnetic field exposure as the incident electron, and thus may also impact the surface of the component, leading to the emission of additional secondary electrons. Under certain circumstances, the electrons (incident and secondary) may bounce back and forth inside the component, driven by the electromagnetic field. Each time an electron impacts the surface of the component, an additional secondary electron may be emitted. This phenomenon, known as multipaction, may lead to an electromagnetic field driven regeneration or avalanching of electrons that can cause deterioration of the component, modulation distortion, instabilities with catastrophic consequences and failure modes in which destruction of the entire component may occur. Electrical components that are exposed to such high-frequency electromagnetic fields are therefore designed to minimize the effects of secondary electron emission and multipaction, and thus reduce the likelihood of a corresponding avalanche failure of the component.

The term "secondary yield coefficient" is used in this field to describe the ratio of the number of secondary electrons generated for each incident electron impacting on the surface of a component. If the secondary yield coefficient is greater than one, meaning that more than one secondary electron is emitted from the surface of the component for each incident electron, then an avalanche-like increase in the number of electrons may occur.

Presently, communication components are typically designed to control secondary electron emission and multipaction through manipulation of the inner-surface geometry of the component. Designers recognize that for any given operational frequency, there is a range of component geometries and power levels for which secondary electron emission will occur. Knowing this, the inner surfaces of the component can be designed so as to control or prevent secondary electron emission, and thus prevent an avalanche failure of the component.

Such a design practice, however, is difficult from a manufacturing standpoint and places constraints on the design dimensions and sizes of the component. Simple designs are often eliminated in favor of more intricate and complicated designs in order to maintain safety margins against multipaction. These constraints on the design adversely limit the form and fit of components. In some cases, larger and multiple components are often necessary to effectively prevent or control secondary electron emission. These limitations present particular disadvantages for communication components onboard spacecraft payloads, such as communication satellites, where size and weight must be minimized. Furthermore, analyzing such components is difficult, and time-consuming, and still does not guarantee the elimination of multipaction. Expensive testing is often necessary to verify the analysis. And even after initial verification, the component materials may degrade with time and exposure to a condition that may result in component failure.

Prevention of multipaction has also been attempted by insertion of a dielectric material into the component, typically in the predicted flight path of any electrons. Using such a dielectric material, however, results in an increase in the loss of the electrical component, and thus a reduction in the power handling capabilities of the device. Therefore, for a given power level, the use of a dielectric results in a larger and heavier component, which is undesirable in many applications, such as communication satellites.

Alternatively, coatings have been applied to the inner surface of components in an attempt to either interrupt the electron flight path or prevent avalanching. This alternative is often not feasible in high power designs, however, due to dielectric heating of the surface and increase in loss; any macroscopically thin dielectric inserted in the path of secondary electrons will prevent multipaction, but may render the component unusable due to an increase in the loss.

While several well-known materials have secondary yield coefficients below 1 (e.g., carbon soot), it is another matter to find a material that will adhere to the inner surface of a component, survive environmental and outgassing testing, resist oxidation and the resultant increase in yield, and not increase the loss of the component. In addition, some surface treatments previously used, such as alodine (alodining is the chemical application of a protective chromate conversion coating on an aluminum alloy), provide a coating of uneven and uncontrollable thickness that is high in loss. There is also some evidence that alodine may actually fail to prevent secondary electron emission. Alodining also presents environmental disadvantages, since it involves the use of chromic acid, and thus disposal of the spent solution is difficult and expensive. Other coatings such as carbon black, while having a low secondary electron yield, have a limited adherence to the surface of a component. For example, carbon black is not feasible for use in space applications, because it fails to maintain adherence to the surface under conditions of a vacuum.

Therefore, a surface treatment is needed that does not interfere with the low-loss requirements of typical electrical components, while still providing a highly conductive surface. Unfortunately, most highly conductive surfaces have secondary electron yield coefficients above one and are therefore prone to multipaction. Moreover, after exposure to air, any resulting surface oxidation leads to a further increase in the secondary yield factor and a resultant increase in multipaction. An appropriate surface treatment must also resist peeling at high temperatures, may not outgas, and preferably does not consist of hazardous materials or create hazardous byproducts. Thus, the ideal surface treatment not only has a secondary yield coefficient of less than 1, but also is low loss, highly conductive, resistant to oxidation over time, resistant to changes over temperature increases, capable of withstanding high temperatures without peeling, resistant to outgassing, and consists of non-hazardous materials.

SUMMARY OF THE INVENTION

A surface treatment and method for applying the surface treatment to electrical components are provided that include a coating of yttrium-iron-garnet (YIG), which is applied to the inner surface of the component preferably by argon sputtering. The coating is preferably sputtered at an argon pressure of $4.5 \times 10^{-2}$ Torr at a RF power of 100 Watts at 13.56 MHz. The resulting coating is about 1.5 micrometers or less in thickness, preferably 0.2 to 0.75 micrometers, most preferably about 0.5 micrometers. When a coating of the invention is applied to a silver-lined component, the secondary yield coefficient is reduced from about 1.4 to less than 1.

DETAILED DESCRIPTION OF THE INVENTION

The present invention is a coating for communication components that reduces the secondary yield coefficient to less than 1, without increasing the loss of the device. The present invention is also directed to a method for applying this coating to a communication component.

The coating material is comprised of yttrium-iron-garnet (YIG). YIG is within the family of materials broadly described as ferrates. The material is available commercially in the form of a compressed, sintered powder, preferably an aluminum-built or gadolinium-built YIG. An exemplary suitable YIG is, available from Trans Tech, Inc., a wholly-owned subsidiary of Alpha Industries (Woburn, Mass.), under the product designation G-1004. Such a YIG comprises 45% oxygen, 2.5% aluminum, 4.5% gadolinium, 28% iron, and 20% yttrium (all percentages are atomic percent, ±2%). Another suitable YIG, also available from Trans Tech, further comprises a small amount of manganese, approximately 0.05%. The surface onto which the coating is sputtered is usually silver-plated, and may alternatively be aluminum or silicon, although this invention is not limited to coatings applied to these particular surfaces.

Figure 1:
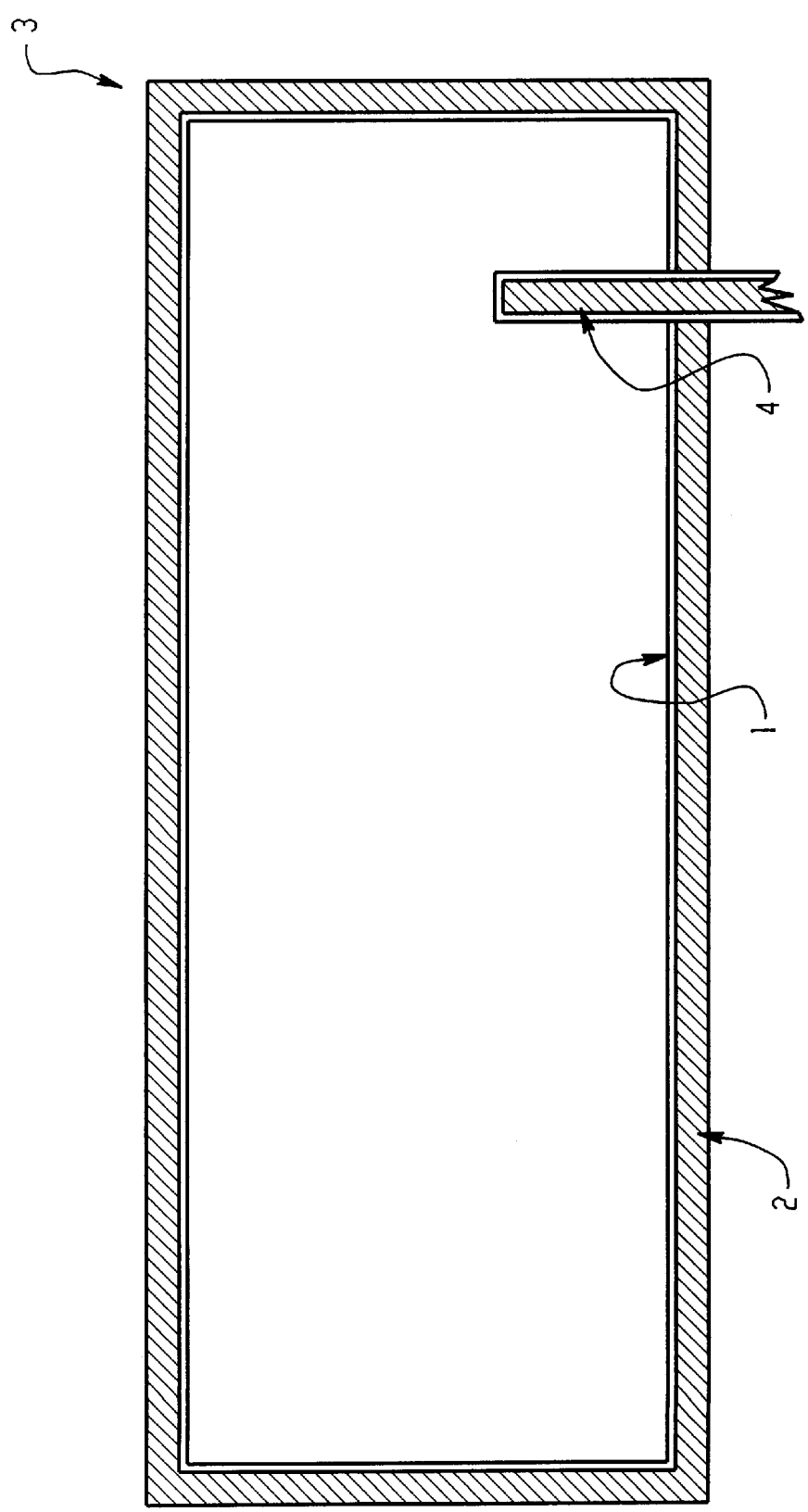
FIG. 1 illustrates the typical placement of a coating of the invention on the inner surface of a component and on a protrusion into the component.

FIG. 1 illustrates a coating of the invention applied to the inner surface of a microwave component. The coating (1) has been applied to the inner surface (2) of the microwave component (3). The coating (1) has also been applied to a protrusion (4) into the structure. In FIG. 1, the inner surface of the component or substrate to which the coating is applied (2) is represented by hatched areas, whereas the coating (1) is represented by non-hatched areas.

According to a preferred method of the invention, the YIG coating is sputtered onto the component surface by means of plasma sputtering. The general process of sputtering requires the displacement of target atoms through the transfer of momentum carried by ions possessing high kinetic energy. Typically, and in the preferred embodiment of this invention, argon is the working gas in the sputtering chamber.

In such a sputtering operation, positively charged Argon ions can be created in a plasma that contains $Ar^+$ and electrons. In the case of plasma sputtering, the coating target, which is the YIG source material, is electrically connected to a voltage source as the cathode, and the inner walls of the component to be coated is connected as the anode. The coating target and the component to be coated are placed in a sputtering chamber, connected to the voltage source, and the pressure in the sputtering chamber is lowered. A voltage is then developed across the two electrodes (anode and cathode), and a discharge plasma is developed that generates electrons and ions and imparts kinetic energy to the ionized working gas. $Ar^+$ ions are extracted from the plasma and accelerated across the dark space to impinge on the coating target. As the $Ar^+$ ions bombard the target, the coating surface material is freed into the sputtering chamber.

During the momentum transfer at the coating target surface, positive and negative target ions and electrons as well as atoms, dimers, and trimers are released. The positive target ions return to the target where they contribute to heating. The negative target ions are attracted to and adhere to the surface of the component, which is electrically charged as the anode.

The sputtering rate is determined by target voltage and current density, as well as chamber pressure. High voltage and current (power) releases more sputtered species; high pressure provides more ion density but simultaneously reduces the energies of the ions and atoms by scatter. By this process, the surface of the target is sputtered. The composition of the sputtered material and thus the deposited layer is dependent on the ions present.

A coating of the invention was made by the following method. A sputter target was made by cutting a ¾" diameter, 3/16" in height circular disc of YIG to a height of ⅛", using a Beuhler low speed diamond saw, and deionized water as a lubricant. The elemental composition of the YIG disc (in atomic percent, ±2 percent) comprised 45% oxygen, 2.5% aluminum, 4.5% gadolinium, 28% iron, and 20% yttrium. The face of the cut YIG disc was ground to a 600–800 grit finish using silicon carbide paper and water as a lubricant.

The prepared YIG disc was then mounted in a water cooled, US' Gun II™ (US Thin Film Products, Inc., California) planar magnetron sputtering source, in the sputter chamber of a SSL-100 XPS instrument. In order to accommodate the ¾" diameter YIG disc, a modified target clamp housing was machined from aluminum. The clean metal substrate (representative of an electrical component) to be coated was then placed in the sputter chamber approximately 2" away from and facing the YIG target. The sputter chamber was allowed to reach $10^{-8}$ Torr before sputtering.

The RF power supply for the magnetron source was then activated and set at a RF power level of 100 Watts at 13.56 MHz. Ultra high purity (UHP) argon gas was then leaked into the sputter chamber via a precision leak valve and the pressure was allowed to increase until a plasma was struck on the YIG target (about $10^{-1}$ Torr). After achieving a sputter plasma, the argon pressure was decreased to $4.5 \times 10^{-2}$ Torr. Under these conditions, a YIG coating is formed on the metal substrate at the rate of approximately 20 nm/minute. Prior to sample sputtering, a new YIG target was sputtered for 1–2 minutes with the chamber empty in order to clean any surface contaminants off the ground face of the disc.

Figure 2:
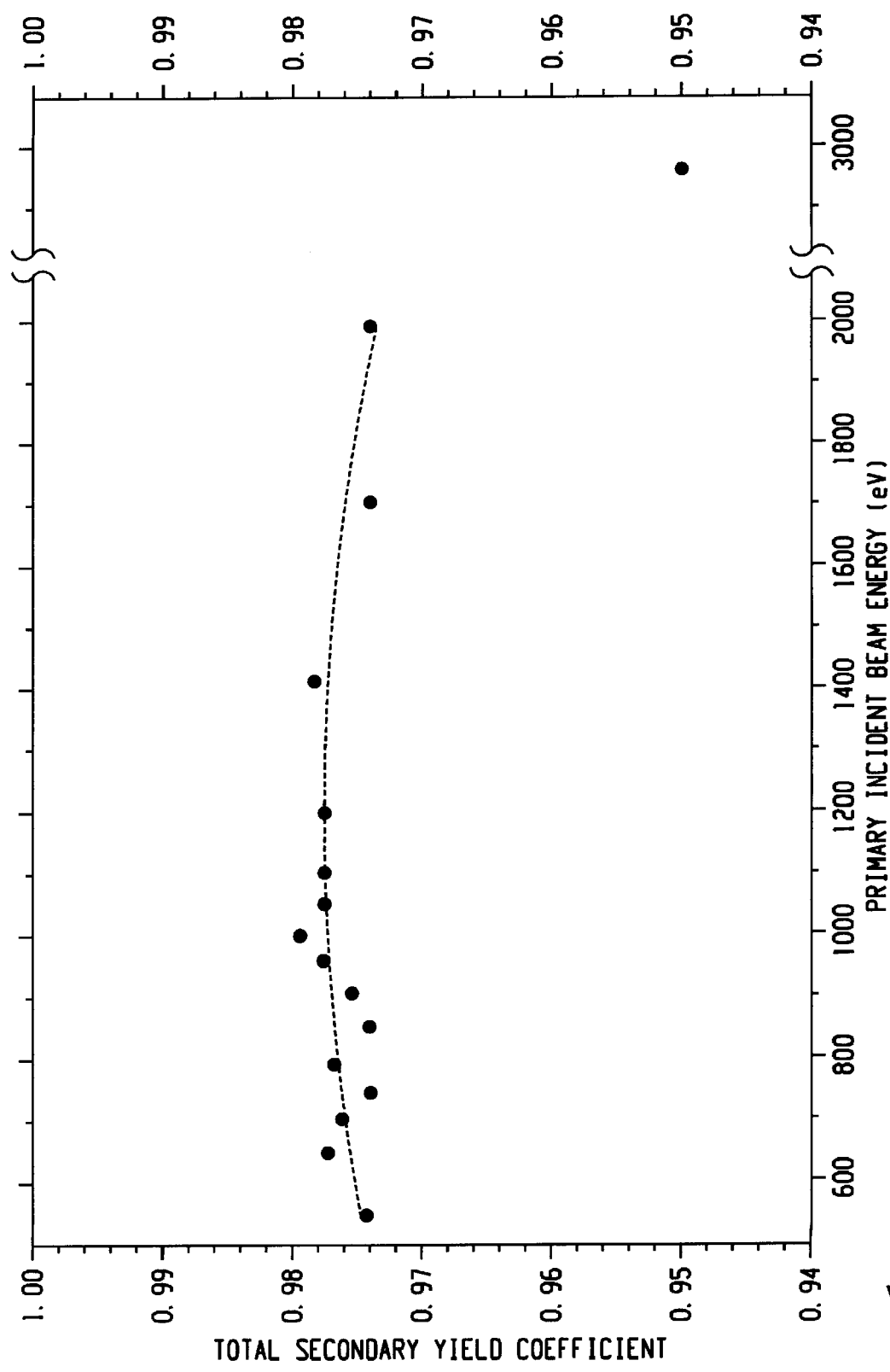
FIG. 2 is a plot of the secondary yield coefficient vs. the primary incident electron beam energy, measured on a coating of YIG approximately 0.5 micrometers in thickness, placed upon the inner surface of a silver/copper/aluminum sample, where the coating was created by 25 minutes of sputtering in Argon gas.

The results of testing a coating of the invention that was formed by Argon sputtering onto the inner surface of a component comprising silver/copper/aluminum is illustrated in FIG. 2. The coating was created by 25 minutes of sputtering, resulting in a coating with a thickness of approximately 0.5 micrometers. The graph (5) illustrates the change in secondary yield coefficient as the primary incident beam energy (measured in eV) was varied across a range as shown. As illustrated in the graph (5), the secondary yield coefficient was less than 1.

A coating time of 25 minutes (equivalent to approximately 0.5 micrometers of coating) was sufficient to reduce the secondary yield coefficient on silver and aluminum substrates to less than 1. Coatings exceeding 1.8–2 micrometers in thickness on aluminum substrates may result in poor adhesion of the film, likely due to stress build up as the film thickens. As well, in coatings beyond about 2 micrometers in thickness, differential thermal expansion due to plasma heating of the substrate during sputtering between the aluminum and growing YIG film may play a part. A satisfactory YIG coating is therefore, about 1.5 micrometers or less in thickness, preferably about 0.2 to about 0.75 micrometers, most preferably about 0.5 micrometers in thickness.

Preferably the RF power is about 100 Watts. Lower RF power causes the sputter rate to drop non-linearly and the resulting sputter YIG film lacks the desired anti-multipaction properties even at longer sputter times. Conversely, if the RF power exceeds 100 Watts, then the YIG target may crack severely which may adversely affect the coating characteristics.

The argon gas pressure is preferably kept very close to the maximum allowed in the magnetron safe source's operation. Lower argon pressures mean lower sputter rates and translate into longer sputter times.

A coating of the invention has the following advantages. The coating itself has a low electron emission, preventing secondary electron emission, and also serves to absorb any secondary electrons emitted from within the component material. Because the coating is of microscopic thickness (about 1.5 micrometers or less, preferably about 0.2 to about 0.75 micrometers, most preferably about 0.5 micrometers), it does not increase the loss of the component upon which it is placed. By the method of the invention, a low loss coating with a secondary yield coefficient of less than 1 can be provided in a relatively quick manner (on the order of approximately 10–30 minutes). The coating controls multipaction independently of frequency or power levels, allowing for the use of one device instead of many. The coating also allows design of the device to any geometry. The resulting devices are therefore simpler, smaller and often lighter. A coating of the invention is also stable in vacuum, under thermal cycling and atmospheric pressure, is resistant to peeling at high temperatures, and is non-toxic. A coating of the invention, with its ability to prevent multipaction at various power and frequency levels provides a particular advantage for use in space applications, where the initiator of multipaction can be a random cosmic ray, of unpredictable power and frequency.

It should be understood that the invention is described herein with reference to particular embodiments, it is to be understood that it is not intended to limit the invention to the specific forms disclosed. On the contrary, it is intended to cover all modifications and alternatives forms falling within the spirit and scope of the invention.

What is claimed is:

1. A microwave device having an inner surface coated with yttrium-iron-garnet and having a secondary yield coefficient of less than 1.

2. A microwave device as defined in claim 1, wherein the coating has a thickness of about 1.5 micrometers or less.

3. A microwave device as defined in claim 1, wherein the coating has a thickness of about 0.2 to about 0.75 micrometers.

4. A microwave device as defined in claim 1, wherein the yttrium-iron-garnet comprises from about 43 to about 47% oxygen, from about 0.5 to about 2.5% aluminum, about 2.5 to about 6.5% gadolinium, from about 26 to about 30% iron, and from about 18% to about 22% yttrium.

5. A microwave device as defined in claim 1, wherein the yttrium-iron-garnet further comprises about 0.05% manganese.

6. A microwave device as defined in claim 1, wherein the inner surface that is coated with yttrium-iron-garnet comprises silver.

7. A microwave device as defined in claim 1, wherein the inner surface that is coated with yttrium-iron-garnet comprises aluminum.

8. A microwave device as defined in claim 1, wherein the inner surface that is coated with yttrium-iron-garnet comprises silicon.

9. A method for producing a microwave device with a secondary yield coefficient of less than 1, having an inner surface that is coated with yttrium-iron-garnet, wherein the coating is deposited by sputtering.

10. A method for producing a microwave device with a secondary yield coefficient of less than 1, having an inner surface that is coated with yttrium-iron-garnet, wherein (a) a substrate surface and a target material of yttrium-iron-garnet are placed into magnetron sputtering source with a sputter chamber;

(b) the sputter chamber is sealed and the pressure inside the chamber lowered;

(c) a RF power supply for the magnetron sputtering source is activated and set at a power level;

(d) a gas is introduced into the sputtering chamber and the pressure inside the chamber is increased to induce a plasma on the target material;

(e) after achieving a sputter plasma, the pressure inside the chamber is decreased; and (f) a yttrium-iron-garnet coating is formed on the substrate surface.

11. A method as defined in claim 10 wherein the pressure in step (b) is lowered to about $10^{-8}$ Torr.

12. A method as defined in claim 10, wherein the RF power supply is set at a power level of about 100 Watts at about 13.56 MHZ.

13. A method as defined in claim 10, wherein the gas of step (d) is ultra high purity argon gas.

14. A method as defined in claim 10, wherein the gas of step (d) is ultra high purity argon gas introduced by leaking into the sputtering chamber via a precision leak valve.

15. A method as defined in claim 10, wherein the pressure in step (d) is increased to about $10^{-1}$ Torr.

16. A method as defined in claim 10, wherein the pressure in step (e) is decreased to about $4.5 \times 10^{-2}$ Torr.

17. A method as defined in claim 10, wherein the coating is formed on the substrate surface at a rate of about 20 nm/minute.

18. A method as defined in claim 10, wherein the yttrium-iron-garnet comprises from about 43 to about 47% oxygen, from about 0.5 to about 2.5% aluminum, about 2.5 to about 6.5% gadolinium, from about 26 to about 30% iron, and from about 18% to about 22% yttrium.

19. A method as defined in claim 18, wherein the yttrium-iron-garnet further comprises about 0.05% manganese.

20. A method as defined in claim 10, wherein the substrate surface comprises silver.

21. A method as defined in claim 10, wherein the substrate surface comprises aluminum.

22. A method as defined in claim 10, wherein the substrate surface comprises silicon.

23. A method as defined in claim 10, wherein the coating has a thickness of about 1.5 micrometers or less.

24. A method as defined in claim 10, wherein the coating has a thickness of about 0.2 to about 0.75 micrometers.

* * * * *